(12) United States Patent
Ertle et al.

(10) Patent No.: US 8,044,394 B2
(45) Date of Patent: Oct. 25, 2011

(54) SEMICONDUCTOR WAFER WITH ELECTRICALLY CONNECTED CONTACT AND TEST AREAS

(75) Inventors: Werner Ertle, Neubiberg (DE); Bernd Goller, Otterfing (DE); Michael Horn, München (DE); Bernd Kothe, Vulaines sur Seine (FR)

(73) Assignee: Infineon Technologies AG, Neubiberg (DE)

( * ) Notice: Subject to any disclaimer, the term of this patent is extended or adjusted under 35 U.S.C. 154(b) by 755 days.

(21) Appl. No.: 10/522,502

(22) PCT Filed: Jul. 29, 2003

(86) PCT No.: PCT/DE03/02544
§ 371 (c)(1),
(2), (4) Date: Nov. 11, 2005

(87) PCT Pub. No.: WO2004/015773
PCT Pub. Date: Feb. 19, 2004

(65) Prior Publication Data
US 2006/0097386 A1       May 11, 2006

(30) Foreign Application Priority Data
Jul. 29, 2002   (DE) .................................. 102 34 648

(51) Int. Cl.
*H01L 23/58* (2006.01)
(52) U.S. Cl. ...... 257/48; 257/499; 257/775; 257/E23.01

(58) Field of Classification Search .................. 257/48, 257/499, 775, E23.01, E23.07; 438/460
See application file for complete search history.

(56) References Cited

U.S. PATENT DOCUMENTS

| | | | |
|---|---|---|---|
| 4,562,455 A | 12/1985 | Okumura et al. | |
| 4,744,061 A * | 5/1988 | Takemae et al. | 365/201 |
| 5,506,499 A | 4/1996 | Puar | |
| 5,684,304 A | 11/1997 | Smears | |
| 5,719,449 A * | 2/1998 | Strauss | 257/786 |
| 5,783,868 A | 7/1998 | Galloway | |
| 5,891,745 A | 4/1999 | Dunaway et al. | |
| 6,133,054 A * | 10/2000 | Henson | 438/17 |
| 6,159,826 A * | 12/2000 | Kim et al. | 438/460 |
| 6,204,074 B1 | 3/2001 | Bertolet et al. | |
| 6,251,694 B1 | 6/2001 | Liu et al. | |
| 6,348,742 B1 | 2/2002 | MacPherson | |
| 6,351,405 B1 | 2/2002 | Lee et al. | |
| 6,359,342 B1 | 3/2002 | Yuan et al. | |
| 6,445,001 B2 * | 9/2002 | Yoshida | 257/48 |
| 6,498,396 B1 | 12/2002 | Arimoto | |
| 2001/0052786 A1 | 12/2001 | Eldridge et al. | |

* cited by examiner

*Primary Examiner* — Lex Malsawma
*Assistant Examiner* — Robert Huber
(74) *Attorney, Agent, or Firm* — Dicke, Billig & Czaja, PLLC

(57) ABSTRACT

The invention relates to an arrangement of contact areas and test areas on patterned semiconductor chips. The contact areas and the test areas are electrically connected to one another via a conduction web. Whereas the contact areas are arranged in a first region, which has no components of an integrated circuit, the test areas lie in a second region of the top side of the semiconductor chip, which region has components of an integrated circuit.

20 Claims, 3 Drawing Sheets

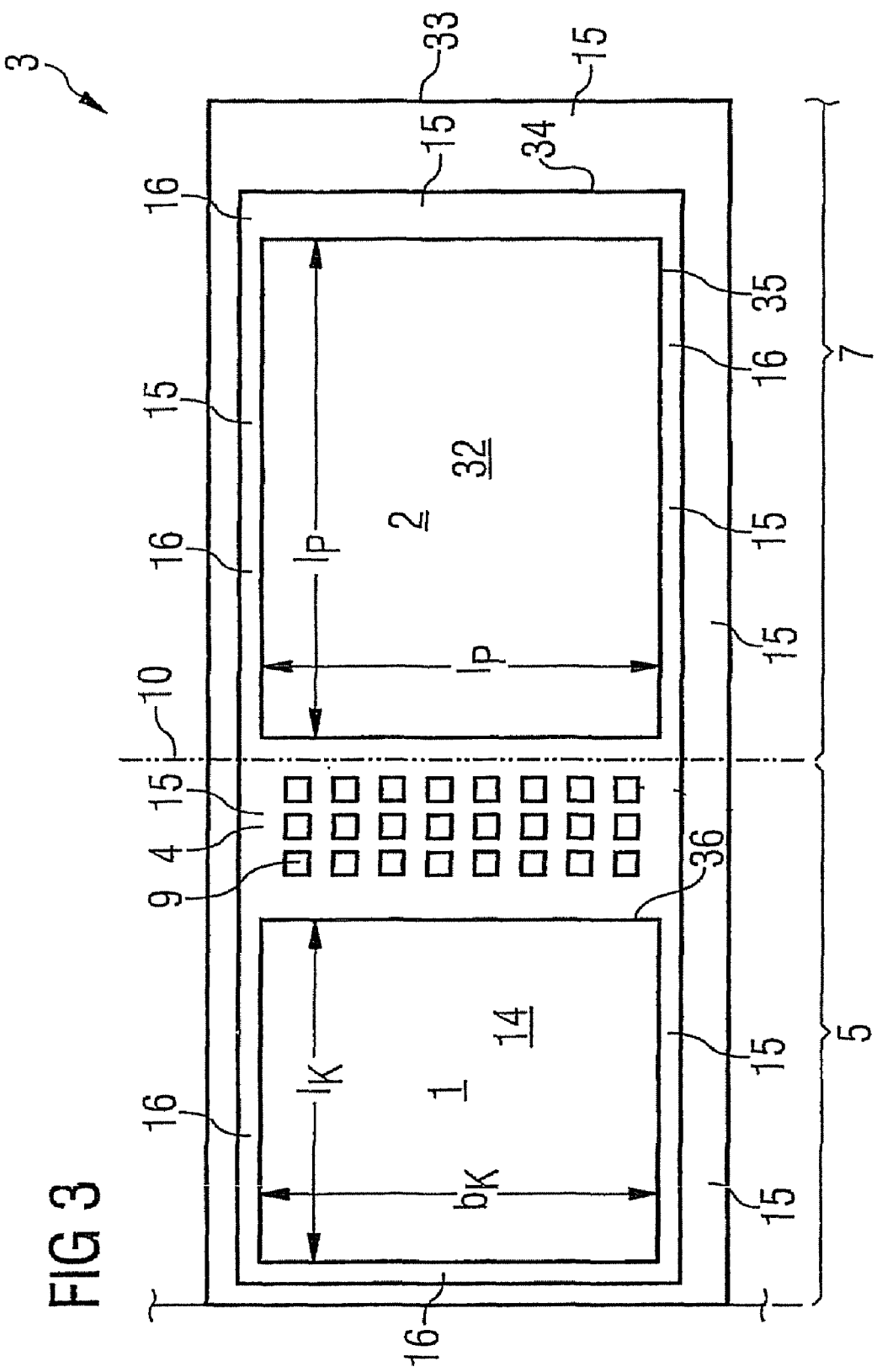

SEMICONDUCTOR WAFER WITH ELECTRICALLY CONNECTED CONTACT AND TEST AREAS

CROSS REFERENCE TO RELATED APPLICATION

This Utility Patent Application claims the benefit of the filing date of German Application No. DE 102 34 648.8, filed Jul. 29, 2002, and International Application No. PCT/DE03/02544, filed Jul. 29, 2003, both of which are herein incorporated by reference.

FIELD OF THE INVENTION

The invention relates to a semiconductor wafer with electrically connected contact and test areas, and to an electronic device having a semiconductor chip of such a semiconductor wafer and a method for processing of the semiconductor wafer.

BACKGROUND

Continuous miniaturization of the contact areas on semiconductor wafers gives rise to problems, in particular, in the context of the functional test at the wafer level of a semiconductor chip since, with an increasing number of contact areas per test in conjunction with miniaturization of the dimensioning of the contact areas, increased contact problems occur during the test. Problems also arise when bonding contact areas which have already been damaged by the functional test on account of the test tips, with the result that increased rejects occur during production.

Document U.S. Pat. No. 5,506,499 discloses providing a test area which is separate from the contact area for bonding and is electrically connected to the contact area. This configuration requires additional chip area in order to accommodate the additional test area besides each contact area on the semiconductor chip. The solution disclosed in U.S. Pat. No. 5,506,499 leads to an enlargement of the required chip area and is at odds with miniaturization endeavors in semiconductor technology.

BRIEF DESCRIPTION OF THE DRAWINGS

The invention is discussed in greater detail on the basis of embodiments with reference to the accompanying figures.

FIG. 3 schematically illustrates an arrangement of a contact area and a test area with a connecting conduction web in accordance with a second embodiment of the invention.

DETAILED DESCRIPTION

Figure 1:
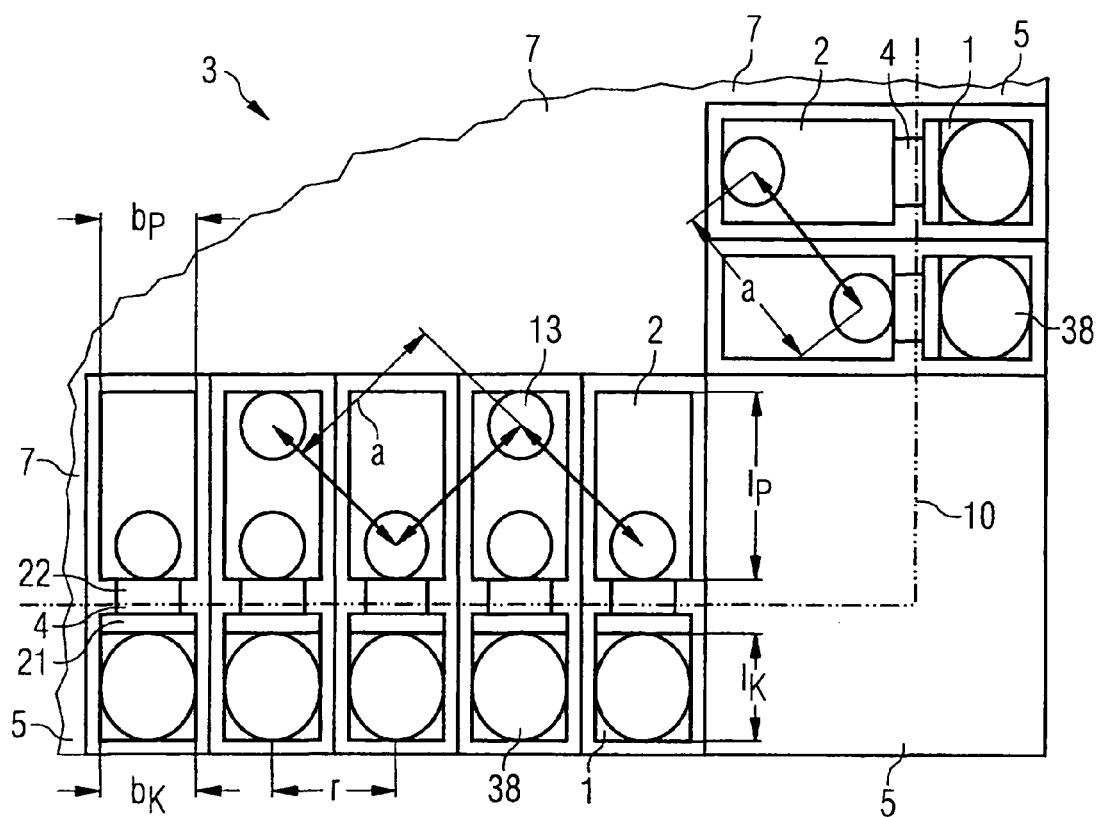
FIG. 1 schematically illustrates an arrangement of contact areas and test areas on a semiconductor chip in accordance with a first embodiment of the invention.

The invention is based on the object of providing semiconductor chips and electronic devices which have smaller external dimensions, a reliable contact-connection and checking of each semiconductor chip being ensured.

In one embodiment, the invention provides a semiconductor wafer having a multiplicity of semiconductor chips, the semiconductor chips having an arrangement of contact areas and test areas which are in each case electrically conductively connected to one another. The contact areas are arranged in a passive, first region of the top side of the semiconductor chip, the passive first region having no components of an integrated circuit. The test areas are arranged in an active, second region of the top side of the semiconductor chip, the active second region has components of an integrated circuit.

This semiconductor wafer has the advantage that the test areas can be significantly enlarged in comparison with the contact areas. More reliable contact-making of the test tips is thus made possible because test tips placed onto the semiconductor wafer in groups in each case have a higher tolerance range available for positioning. Moreover, the test tips have space for small movements and they can be applied on a larger area of the test areas. At the same time, the area requirement per semiconductor chip is reduced since a passive, first region of the surface without components of an integrated circuit need be provided only for contact areas and no longer also for the test areas. The number of semiconductor chips per semiconductor wafer can be increased. Moreover, the area of the semiconductor wafer that is required for a respective semiconductor chip is considerably reduced in conjunction with improved test conditions and improved bonding conditions.

The passive, first region of a semiconductor chip is preferably utilized for contact areas in order that the components of the active, second region are not exposed to any thermal and mechanical loading during connection to bonding wires or to flip-chip contacts. This combats the risk of the properties of the active components being altered by thermal and mechanical loading. This loading does not occur during a functional test carried out on the test areas.

It is also possible for a plurality of test tips to be placed simultaneously on a length of test areas that is increased compared with the length of the contact areas, which increases the test reliability. Thus, by way of example, one test tip can offer the measurement signal, while a second test tip on the same test area checks and measures whether the measurement signal is available with full magnitude on the test area.

Moreover, it is possible, in an advantageous manner, for a plurality of test tips to be arranged in offset fashion from test area to test area, with the result that it is possible to comply with a predetermined minimum test tip spacing. For this reason, semiconductor chips according to the invention can also be checked by means of measuring apparatuses whose minimum test tip spacing is larger than the center-to-center distance between the contact areas. Thus, by way of example, it is possible to use test cards having a measuring tip spacing of 90 micrometers, for example, even though the center-to-center distance between the contact areas is only 50 micrometers, for example.

In comparison with the prior art of U.S. Pat. No. 5,506,499, the surface requirement for a semiconductor chip is significantly reduced by means of the invention. With the same surface requirement, it is then possible to provide a larger number of contact areas. In comparison with U.S. Pat. No. 5,506,499, it is also possible to achieve a significantly reduced pitch of the contact areas.

Moreover, it is possible to carry out multiple measurements on a test area one after the other, the respective measurement point being offset in the region of the test area. Arranging the test areas in the second region of the top side of the semiconductor chip with components of an integrated circuit consequently affords greater reliability of the functional tests without increasing the surface requirement of a semiconductor chip. In this case, test areas and contact areas may be formed on the same interconnect plane.

If an electrically insulating layer is arranged in the active region between the active components of an integrated circuit and the test areas, then short circuits between the electrodes of the active components of an underlying integrated circuit are prevented. Such an electrically insulating layer need not necessarily be provided on the passive region because no interconnects of the integrated circuit emerge there. Such an insulating layer may have silicon dioxide and/or silicon nitride. Owing to the high breakdown strength of these materials, insulating layers having thicknesses in the region of one micrometer may already suffice.

The material of the test areas and/or of the contact areas may comprise aluminum or an aluminum alloy. A contact area or a test area may also form the top side of a multilayer coating, the test area and/or the contact area having palladium or tantalum as a layer in the multilayer layer. In this case, palladium and tantalum form diffusion barriers for silicon atoms and at the same time reduce the migration of aluminum or aluminum alloys.

The test areas and/or the contact areas may have, as the topmost layer, gold or a gold alloy, which is particularly resistant to oxidation, corrosion and erosion. Furthermore, the test areas and/or the contact areas may have copper or a copper alloy as base layer. In this case, an aluminum or gold coating of the test and/or contact areas is protected against copper diffusion by means of a metal alloy layer for example comprising titanium alloys, tantalum compounds or nickel alloys as intermediate layer.

In the region of the conduction web which is arranged between a contact area and a test area, it is possible, in a particularly advantageous manner, to provide through contacts through the insulation layer between test contacts and electrodes of components of the underlying integrated circuit. These through contacts connect the contact areas in the region of the conduction webs to electrodes of the components of the integrated circuit via interconnects arranged below the insulating layer. A matrix of through contacts makes the surface of the conduction web appear uneven. According to the invention, the through contacts are no longer arranged below the contact areas or below the test areas, as a result of which, in particular, a disturbance-free contact area is available for the fitting of bonding connections or of flip-chip contacts.

Such interconnects may be realized from copper or from a copper alloy. A diffusion-inhibiting metal layer may then also be provided between through contacts and copper lines.

A further embodiment of the invention provides for the contact areas to be optimized with regard to their dimensions. In this case, a square or circular contour results in a plan view. This promotes miniaturization of the passive, first region of a semiconductor chip surface that is to be provided and thus an increased number of semiconductor chips on a semiconductor wafer.

Insulation and passivation layers provided on the semiconductor chip may be constructed in multilayer fashion. In a further embodiment of the invention, a silicon dioxide layer is arranged directly on the edges of the contact areas and of the test areas and on the entire connecting conduction web. A silicon nitride layer is provided between said silicon dioxide layer and a terminating polyimide layer because a polyimide layer provided directly on a silicon dioxide layer tends toward delamination. This layer construction according to the invention has the advantage of an improved adhesion.

What is more, this layer sequence has the advantage that, by means of chemical vapor deposition, firstly both the silicon dioxide layer and the silicon nitride layer can be deposited over the whole area and in an unpatterned manner and, finally, the photosensitive polyimide layer can be applied, into which contact windows or test windows are then introduced photolithographically. After short plasma etching steps, the underlying silicon nitride layer and the silicon dioxide layer still present can be selectively removed, so that the contact areas are uncovered for bonding or application of flip-chip contacts and in addition to each of the contact areas a window is present in the insulation and passivation layer for testing.

Particularly if a large number of through contacts are to be arranged in the region of the conduction web, then the latter may also be formed in T-shaped fashion. In this case, the through contacts to the copper interconnects are provided in the wider transverse bar of the T, which may correspond to the width of a contact window in the passivation layer. The width of the longitudinal bar of the T can be optimized with regard to a maximum envisaged current loading during testing by test tips in order that an undesirable interruption of the electrical connection between test area and contact area does not occur during the test process.

The test areas may have a length greater than their width, their width depending on the width of the contact areas. Preferably, the length of the test areas is at least 1.5 times greater than the width thereof; in particular, it is advantageous if the length of the test area is at least 2 times greater than the width thereof. With these length to width ratios, the test areas have the advantage that a placement of two test tips on test areas located directly next to one another, said placement being offset in the longitudinal direction of the test areas, is permissible. In this case, the length of the test areas depends on a minimum distance between the two test tips. Consequently, it is also possible to use test devices with test tips whose minimum spacing is significantly larger than the center-to-center distance or "pitch" between the contact areas of the semiconductor chip according to the invention. Consequently, an equipment that can actually be employed only in the case of an increased pitch can be used for testing. A smaller pitch can nevertheless be tested with a high-performance equipment since the test tips can be arranged in offset fashion on the test areas according to the invention.

The above advantages of an arrangement of contact areas and test areas according to the invention also apply to electronic devices having semiconductor chips.

With the electronic device according to the invention, in contrast to U.S. Pat. No. 5,506,499, only the contact areas need be provided in a passive, first region. The entire active, second region of the top side of a semiconductor chip with components of integrated circuits is then available for the arrangement of test areas. In comparison with U.S. Pat. No. 5,506,499, it is thus possible to provide a reduced pitch for bonding connections or for flip-chip contacts. At the same time, the test areas can be made as large as desired as long as their width is adapted to the pitch of the bonding connections or the pitch of the flip-chip contacts and the required semiconductor chip area is minimized. The space requirement of the electronic device according to the invention is also reduced as a result.

Arranging the test areas in the second region of the top side of the semiconductor chip with components of an integrated circuit furthermore enables a higher density of the possible bonding connections or of the possible flip-chip contacts for a semiconductor chip without increasing the surface requirement of a semiconductor chip. Rather, the surface requirement is reduced further in comparison with the solution disclosed in U.S. Pat. No. 5,506,499.

In a method according to the invention, a semiconductor wafer having a multiplicity of regions of each semiconductor chip is reworked. After providing a semiconductor wafer having test areas in a region with components of an integrated circuit, a functional test is carried out thereupon. In this case, defective semiconductor chips are marked and, optionally, the test areas of the semiconductor chips on the entire wafer are then sealed. In this case, the test areas may be sealed by application of an, in particular patterned, photoresist layer or soldering resist layer, to be precise with the contact areas being left free. In this case, the soldering resist layer prevents subsequent undesired contact-connection of the test areas with flip-chip technology because it is then no longer possible for any soldering balls to adhere thereto. A possible photoresist provided suffices for avoiding incorrect bonds.

To summarize, it shall be emphasized that the essential problem of probing or testing the functionality of a semiconductor chip at the wafer level and of bonding in order to produce bonding connections is solved by separating the openings or windows for probing and bonding by means of this invention. Moreover, the test openings are arranged above active structures in this invention, so that additional semiconductor area regions without any active function are to be used or are required only for the contact openings and the contact areas.

The probing opening above active structures can thus be chosen to be relatively large without influencing the chip area size, this size then permitting a situation in which, vertical test tips or needle cards such as are otherwise used only for large pitches, can now also be used for arbitrarily reduced pitches if, by way of example, the test tips or needles are arranged offset with respect to one another in two rows.

FIG. 1 illustrates a section of a semiconductor chip 3 in accordance with a first embodiment of the invention. The semiconductor chip 3 is subdivided into a passive, first region 5, which has no components of an integrated circuit, and into a second region 7, which has active components of an integrated circuit that is not visible here. The boundary between the first region 5 and the second region 7 is marked by the dash-double-dotted line 10.

Contact areas 1 are arranged on the first region 5. Test areas 2 are provided on the second region 7. The width $b_K$ of the contact areas 1 depends on the desired pitch r of the bonding connections or on the desired pitch r of the flip-chip contacts which are to be accommodated thereon. In this case, the pitch r is approximately 60 µm. The width $b_K$ of the contact areas 1 is approximately 52 µm. The contact areas 1 are optimized with regard to their area extent to give the desired pitch and have a square structure. The length $l_K$ of the contact areas 1 is accordingly approximately 52 µm.

A contact area 1 and a test area 2 are respectively connected to one another via a conduction web 4. These components are fabricated using micrometer technology. The conduction web 4 is formed in T-shaped fashion. In its transverse bar 21, it has through contacts (not shown here) to underlying interconnect layers.

Bonding balls 38 are arranged on the contact areas 1.

The surface of the semiconductor chip 3 is covered by an insulation and passivation layer apart from regions of contact windows and test windows, which correspond here to the contact areas 1 and to the test areas 2. Said insulation and passivation layer is essentially applied in order to protect the active components of the integrated semiconductor circuits in the second region 7.

The T-shaped conduction web 4 has a longitudinal bar 22, which connects the region of the contact area 1 to the region of the test area 2. Given a constant width $b_P$, the test area 2 may, in principle, have an arbitrary length $l_P$ without taking up an additional surface of the semiconductor chip 3. The length $l_P$ is 125 µm in this embodiment of the invention. It emerges from the geometrical boundary conditions that it is possible to work with a test tip card that prescribes a minimum distance between the test tips of 90 µm without problems occurring in this case. The distance a in FIG. 1 identifies the minimum test tip distance between two measuring points 13 of such a test tip card. For this purpose, the measuring points 13 of adjacent test areas 2 are arranged offset with respect to one another in relation to the longitudinal axis of the test areas.

In an exemplary embodiment that is not illustrated here, the test areas are lengthened in such a way that two test tips can be placed simultaneously on one test area.

Figure 2:
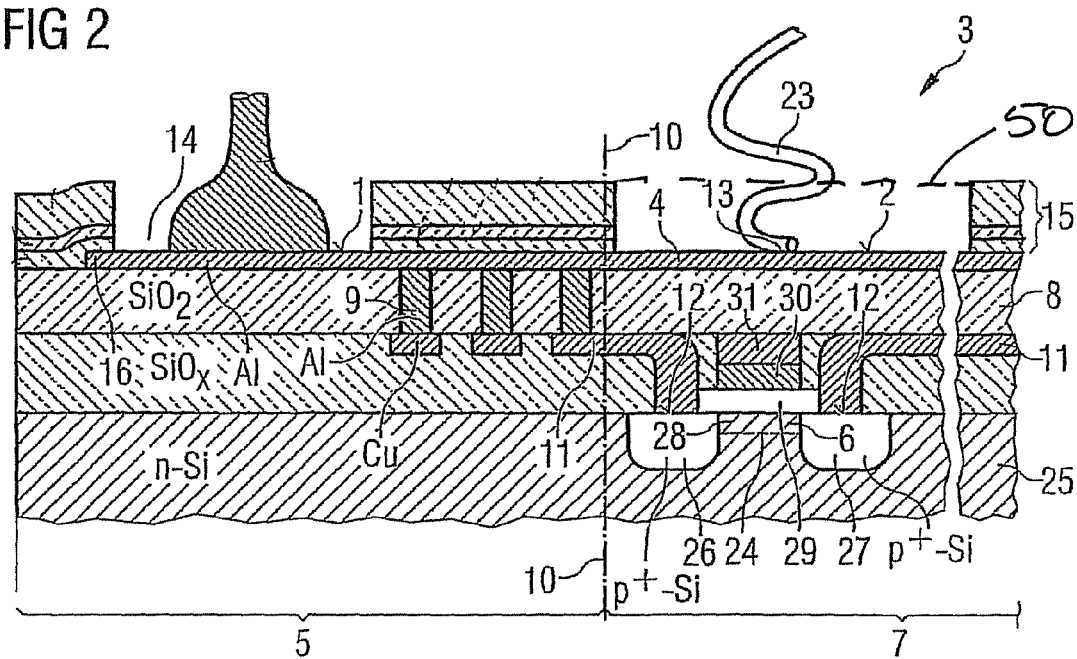
FIG. 2 illustrates a schematic cross section through a semiconductor chip with the arrangement illustrated in FIG. 1.

FIG. 2 illustrates a cross section through a semiconductor chip 3 with the arrangement of contact areas 1 and test areas 2 that is illustrated in FIG. 1. Components having functions identical to those in FIG. 1 are identified by the same reference symbols and are not discussed separately.

The arrangement comprising contact area 1, connecting conduction web 4 and test area 2 that is shown here has a monolayer layer Al made of an aluminum alloy. In the region of the conduction web 4, said layer is connected to through contacts 9 constructed from an aluminum alloy. The through contacts 9 pass through the electrically insulating layer 8 made of silicon dioxide and connect the contact area 1 to underlying interconnects 11 made of copper that are fabricated using submicron technology. These interconnects 11 extend into the active region 7 of the semiconductor chip 3, which has a plurality of MOS transistors 24 in this embodiment of the invention.

Said MOS transistors 24 are embedded in an n-conducting silicon single-crystal region 25 and have a $p^+$-type Si region as source 26 of the MOS transistor 24 and a further $p^+$-type Si region as drain 27. A channel region 28 is arranged in between, said channel region being covered by a gate oxide 29 and being controlled by a gate electrode 30 made of polycrystalline silicon that is realized using submicron technology. A copper lead 31 is arranged thereabove, which may be connected to the through contacts 9. The electrically insulating layer 8, which has silicon dioxide in this embodiment of the invention, is arranged between such an active component of an integrated circuit and the test area 2. Consequently, when testing the function of the semiconductor chip 3 with a test tip 23 in the overlying measuring point 13, the underlying active component is not electrically loaded. A mechanical loading of these underlying components is avoided by virtue of the provision of the elastically configured test tip.

FIG. 3 illustrates a schematic plan view of an arrangement according to the invention within a boundary line 33, the width of which corresponds to the pitch of desired bonding connections or to the pitch of desired flip-chip contacts of approximately 60 µm. Components having functions identical to those in the previous figures are identified by the same reference symbols and are not discussed separately. The arrangement is arranged with the smaller portion above the first, passive region 5 and with a larger portion on the second region 7 with active components of the semiconductor chip 3. The dash-double-dotted line 10 identifies the boundary between the underlying passive region 5 and the underlying second, active region 7.

The arrangement is formed on a continuous metalized area whose external contour is described by the boundary line 34. A contact area 1 and a test area 2 are provided on the metalized area, to be precise in each case with a width of approximately 56 µm. Situated in between, with a constant width of approximately 56 µm, is a region of a conduction web 4 from which through contacts 9 lead to underlying copper interconnects.

Virtually the entire region of the conduction web 4 including the through contacts 9 is covered by the insulation and passivation layer 15. The insulation and passivation layer 15 also covers the edges 16 of the contact area 1 and of the test area 2. Only a square contact window 14 of 52×52 μm and a rectangular test window 32 of 52×125 μm remain free of the insulation and passivation layer 15. Within the contact window 14 and the test window 32 there remains access to the metalized area.

After testing on the test window 32, the latter is sealed with a protective layer 50.

The invention claimed is:

1. A semiconductor chip comprising:
   a passive first region extending from a top side to a bottom side of the semiconductor chip, the top side of the semiconductor chip defining a plane;
   an active second region on the top side of the semiconductor chip;
   an arrangement of contact areas and test areas having respective top surfaces which are arranged in a common plane that is parallel to the plane of the top side of the semiconductor chip, wherein the top sides of the contact areas are square and have width and height dimensions, and the top sides of the test areas are rectangular with larger length dimensions than the width dimensions of the contact areas;
   a plurality of bonding balls arranged on the contact areas;
   the contact areas and test areas are in each case electrically conductively connected to one another via a conduction web that has a top surface that lies in the common plane, the contact areas being arranged in the passive first region, the passive first region having no active components of an integrated circuit, the test areas being arranged in the active second region, the active second region having active components of an integrated circuit, and wherein the test areas are sealed and the contact areas are not sealed;
   an insulating layer situated between the top side and a lower plane;
   through contacts extending through a portion of the insulating layer directly below the conduction web and extending from the conduction web to the lower plane, the through contacts being connected to interconnects that are connected to electrodes of the components of the integrated circuit;
   wherein portions of the insulating layer directly below the contact areas and the test areas are free from the through contacts.

2. The semiconductor chip of claim 1, comprising wherein the insulating layer includes silicon dioxide and/or silicon nitride arranged between the components of an integrated circuit and the test areas of the semiconductor chip.

3. The semiconductor chip of claim 1, comprising wherein the interconnects to the electrodes of the components of the integrated circuit comprise copper or a copper alloy.

4. The semiconductor chip of claim 1, comprising wherein the contact areas and the test areas at their edges and the conduction web on its top side have a multilayer insulation and passivation layer.

5. The semiconductor chip of claim 4, comprising wherein the multilayer insulation and passivation layer includes a silicon dioxide layer arranged directly on the edges of the contact areas and of the test areas and on the connecting conduction web.

6. The semiconductor chip of claim 4, comprising wherein the multilayer insulation and passivation layer comprises a silicon nitride layer and a polyimide layer.

7. The semiconductor chip of claim 1, comprising wherein the conduction web is formed in T having a transverse bar and a longitudinal bar, the transverse bar of the T having a width about equal to a width of the contact areas and having through contacts to interconnects, while the longitudinal bar of the T has a width determined in response to the maximum current loading during testing by test tips.

8. The semiconductor chip of claim 1, comprising wherein the width dimensions of the test areas are about equal to the width dimensions of the contact areas and the length dimensions of the test areas are greater than the width dimensions of the test areas.

9. An electronic device comprising:
   a semiconductor chip having a top side that defines a plane, the semiconductor chip having an arrangement of contact areas and test areas which are arranged in a common plane that is parallel to the plane of the top side of the semiconductor chip and are in each case electrically conductively connected to one another via a conduction web that lies in the common plane, the contact areas being arranged in a passive, first region extending from a top side to a bottom side of the semiconductor chip, the passive first region having no active components of an integrated circuit, wherein the test areas are sealed and the contact areas are not sealed;
   a plurality of bonding balls arranged on the contact areas;
   the test areas being arranged in an active, second region of the top side of the semiconductor chip, the active second region having active components of an integrated circuit;
   the test areas and contact areas being formed in the same interconnect plane;
   the test areas having a length (lp) being at least approximately 1.5 times greater than a width (bp) thereof, and the contact areas being square with a width approximately equal to the width (bp) of the test areas;
   an insulating layer situated between the top side and a lower plane;
   through contacts extending through a portion of the insulating layer directly below the conduction web and extending from the conduction web to the lower plane, the through contacts being connected to interconnects that are connected to electrodes of the components of the integrated circuit;
   wherein portions of the insulating layer directly below the contact areas and the test areas are free from the through contacts.

10. The electronic device of claim 9, the semiconductor chip wherein:
    the insulating layer includes silicon dioxide and/or silicon nitride arranged between the components of an integrated circuit and the test areas of the semiconductor chip.

11. The electronic device of claim 10, comprising wherein the interconnects to the electrodes of the components of the integrated circuit comprise copper or a copper alloy.

12. The electronic device of claim 11, comprising wherein the contact areas and the test areas at their edges and the conduction web on its top side have a multilayer insulation and passivation layer, and wherein the multilayer insulation and passivation layer includes a silicon dioxide layer arranged directly on the edges of the contact areas and of the test areas and on the connecting conduction web.

13. The electronic device of claim 11, comprising wherein the multilayer insulation and passivation layer comprises a silicon nitride layer and a polyimide layer.

14. The semiconductor chip of claim 10, comprising wherein the conduction web is formed in T having a transverse bar and a longitudinal bar, the transverse bar of the T having a width about equal to a width of the contact areas and having through contacts to interconnects, while the longitudinal bar of the T has a width determined in response to the maximum current loading during testing by test tips.

15. A semiconductor wafer comprising:
a plurality of semiconductor chips each having a top side that defines a plane and a passive first region and an active second region, the semiconductor chips having an arrangement of contact areas and test areas which are arranged in a common plane that is parallel to the plane of the top side of the semiconductor chip and are electrically conductively connected to one another via a conduction web that lies in the common plane, wherein the test areas are sealed and the contact areas are not sealed;
a plurality of bonding balls arranged on the contact areas;
the contact areas being arranged in the passive first region extending from the top side to a bottom side of the semiconductor chip, the passive first region having no active components of an integrated circuit, wherein the top sides of the contact areas are square and have width and height dimensions; and
the test areas being arranged in the active second region of the top side of the semiconductor chip, the active second region having active components of an integrated circuit, wherein the top sides of the test areas are rectangular with larger length dimensions than the width dimensions of the contact areas;
an insulating layer having through contacts arranged in the region of the conduction web and extending from the conduction web to a lower plane, the through contacts being connected to interconnects that are connected to electrodes of the components of the integrated circuit;
wherein the contact areas and the test areas are free from the through contacts;
each of the semiconductor chips being defined by a boundary extending around the respective semiconductor chip, the contact areas and the test areas are completely situated within the boundary the respective semiconductor chip.

16. A semiconductor chip comprising:
a passive first region extending from a top side to a bottom side of the semiconductor chip, the top side of the semiconductor chip defining a plane;
an active second region on the top side of the semiconductor chip;
an arrangement of contact areas and test areas which are arranged in a common plane that is parallel to the plane of the top side of the semiconductor chip and are in each case electrically conductively connected to one another via a conduction web that lies in the common plane, the contact areas being arranged in the passive first region, the passive first region having no active components of an integrated circuit, the test areas being arranged in the active second region, the active second region having active components of an integrated circuit, wherein the test areas are sealed and the contact areas are not sealed, and wherein the top sides of the contact areas are square and have width and height dimensions and the top sides of the test areas are rectangular with larger length dimensions than the width dimensions of the contact areas;
a plurality of bonding balls arranged on the contact areas; and
an insulating layer situated between the top side and a lower plane;
through contacts extending through a portion of the insulating layer directly below the conduction web and extending from the conduction web to the lower plane, the through contacts being connected to interconnects that are connected to electrodes of the components of the integrated circuit;
wherein portions of the insulating layer directly below the contact areas and the test areas are free from the through contacts.

17. The semiconductor chip of claim 1, wherein each of the contact areas is electrically conductively connected to a respective one of the test areas by the conduction web extending between and in the same plane as the contact area and the respective test area.

18. The semiconductor chip of claim 1, further comprising:
a boundary defining the area of the semiconductor chip;
a continuous metalized area situated within the boundary;
wherein the contact areas and the test areas are formed on the metalized area, such that the contact areas and the test areas are situated within the boundary the semiconductor chip.

19. The semiconductor chip of claim 1, wherein the test areas are sealed with a patterned photoresist layer.

20. The semiconductor chip of claim 1, wherein the test areas are sealed with a soldering resist layer.

* * * * *